United States Patent
Endo

(10) Patent No.: US 7,985,695 B2
(45) Date of Patent: Jul. 26, 2011

(54) FORMING SILICON OXIDE FILM FROM RF PLASMA OF OXIDIZING GAS

(75) Inventor: Nobuyuki Endo, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/238,160

(22) Filed: Sep. 25, 2008

(65) Prior Publication Data

US 2009/0085171 A1   Apr. 2, 2009

(30) Foreign Application Priority Data

Sep. 28, 2007   (JP) ................. 2007-256015
Sep. 22, 2008   (JP) ................. 2008-242221

(51) Int. Cl.
*H01L 21/31*   (2006.01)
*H01L 21/469*  (2006.01)

(52) U.S. Cl. ........ 438/771; 257/632; 438/765; 438/773; 118/715

(58) Field of Classification Search ........... 257/E21.285; 118/715
See application file for complete search history.

(56) References Cited

U.S. PATENT DOCUMENTS

| | | | |
|---|---|---|---|
| 4,484,210 A * | 11/1984 | Shiraki et al. ................. 257/233 |
| 5,734,195 A | 3/1998 | Takizawa et al. ............ 257/607 |
| 5,874,348 A | 2/1999 | Takizawa et al. ............ 438/473 |
| 6,140,213 A | 10/2000 | Takizawa et al. ............ 438/473 |
| 6,399,520 B1 | 6/2002 | Kawakami et al. .......... 438/778 |
| 2005/0005844 A1 | 1/2005 | Kitagawa et al. ............ 118/715 |
| 2005/0215015 A1 * | 9/2005 | Ahn et al. ..................... 438/287 |
| 2006/0286776 A1 * | 12/2006 | Ranish et al. ................ 438/478 |
| 2007/0071908 A1 * | 3/2007 | Rossman ...................... 427/569 |
| 2007/0128880 A1 * | 6/2007 | Kitagawa et al. ............ 438/758 |

FOREIGN PATENT DOCUMENTS

| | | |
|---|---|---|
| JP | 06-338507 | 12/1994 |
| JP | 6-338507 | 12/1994 |
| JP | 2000-260767 | 9/2000 |
| JP | 2000-286259 | 10/2000 |
| JP | 2004-349546 | 12/2004 |

OTHER PUBLICATIONS

ULSI Fabrication Contamination Control Technique, Science Forum, pp. 89-97, 1992 and translation of pp. 89-94.

* cited by examiner

*Primary Examiner* — Marcos D Pizarro
*Assistant Examiner* — Raj Gupta
(74) *Attorney, Agent, or Firm* — Fitzpatrick, Cella, Harper & Scinto

(57) ABSTRACT

An oxide film formation method comprises steps of: generating a plasma from a gas mixture containing an inert gas and an oxidizing gas whose mixing ratio to the inert gas is higher than 0, and is 0.007 or lower; and forming an oxide film on a surface of a silicon substrate by using the plasma.

6 Claims, 4 Drawing Sheets

FORMING SILICON OXIDE FILM FROM RF PLASMA OF OXIDIZING GAS

BACKGROUND OF THE INVENTION

1. Field of the Invention

The present invention relates to an oxide film formation method and image sensing apparatus.

2. Description of the Related Art

To form an insulating film on a silicon substrate, a semiconductor device manufacturing process uses a method (to be referred to as "thermal oxidation" hereinafter) of forming an oxide film on the surface of the silicon substrate by exposing it to a high-temperature oxidizing ambient. Since, however, thermal oxidation like this is performed at about 1,000° C., impurity diffusion or substrate strain occurs. Therefore, a silicon oxide film formation method replacing thermal oxidation is being developed.

Japanese Patent Laid-Open No. 2000-286259 has disclosed a method (to be referred to as "plasma oxidation" hereinafter) of supplying a gas mixture containing an inert gas and an oxidizing gas such as oxygen, and forming a silicon oxide film by using a plasma generated by applying radio-frequency power (RF power).

In the method of Japanese Patent Laid-Open No. 2000-286259, energy released when the excited inert gas shifts to the ground state is emitted to oxygen molecules, thereby efficiently generating oxygen atoms and oxygen radicals. An oxide film can be formed on a silicon substrate at a low temperature by making these oxygen atoms and oxygen radicals react with silicon.

SUMMARY OF THE INVENTION

The present inventor, however, has found the problem that the method of Japanese Patent Laid-Open No. 2000-286259 makes the level of metal contamination higher than that of a normal thermal oxide film. When the level of metal contamination of an oxide film increases, the oxide film breakdown voltage of a MOS capacitor decreases (The ULSI Fabrication Contamination Control Technique, Science Forum). Metal contamination also produces a white spot defect in a photoelectric converter (Japanese Patent Laid-Open No. 6-338507).

The present invention has been made in consideration of the above problems, and provides for reducing the level of metal contamination of an oxide film formed on a silicon substrate by plasma oxidation.

According to the first aspect of the present invention, there is provided an oxide film formation method comprising steps of: generating a plasma from a gas mixture containing an inert gas and an oxidizing gas whose mixing ratio to the inert gas is higher than 0, and is 0.007 or lower; and forming an oxide film on a surface of a silicon substrate by using the plasma.

According to the second aspect of the present invention, there is provided an image sensing apparatus formed on a silicon substrate on which an oxide film is formed by the oxide film formation method described above.

The present invention can reduce the level of metal contamination of an oxide film formed on a silicon substrate by plasma oxidation.

Further features of the present invention will become apparent from the following description of an exemplary embodiment with reference to the attached drawings.

DESCRIPTION OF THE EMBODIMENTS

Figure 1:
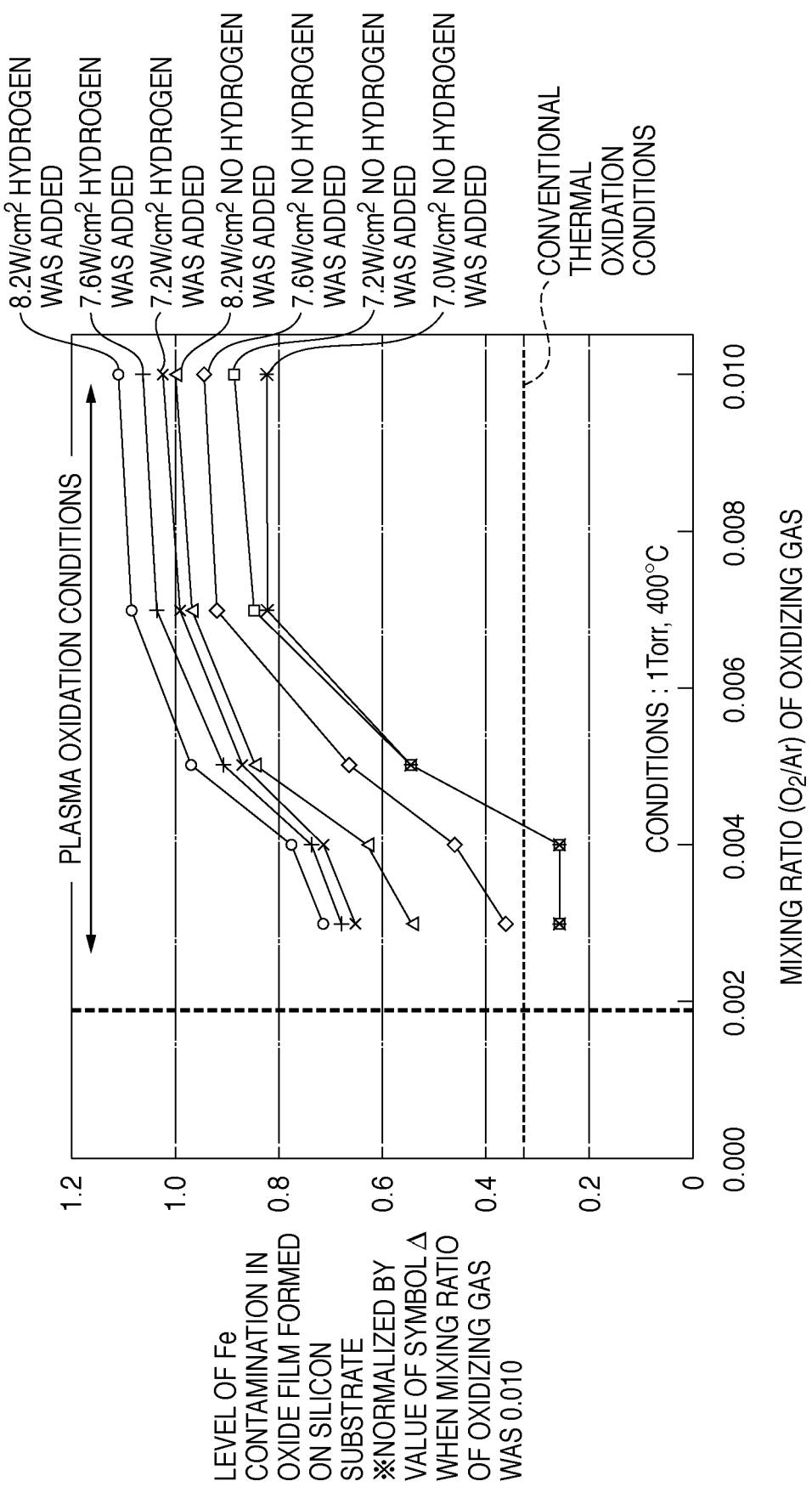
FIG. 1 is a graph showing the level of Fe contamination of a silicon oxide film.

A preferred embodiment of the present invention will be explained in detail below with reference to the accompanying drawings. Note that the scope of the present invention is not limited to the conditions such as the arrangements and layouts of individual parts, the impurity types, and the internal pressure of a processing chamber described in the following explanation. In this specification, the mixing ratio of a plurality of gases represents the flow rate ratio (unit; sccm: standard cc/min) of the gases to be mixed.

First, a method of forming an oxide film on the surface of a silicon substrate by plasma oxidation and a plasma apparatus for implementing the method will be explained below with reference to FIG. 4. A silicon substrate 401 as an object of plasma oxidation is loaded into a processing chamber 400 exhausted to a vacuum state by a vacuum pump 408. Then, an inert gas and oxidizing gas are supplied into the processing chamber 400, and a plasma is generated by applying radio-frequency power RF from an electrode (e.g., a slot antenna) 402 to the gas mixture, thereby forming an oxide film on the surface of the silicon substrate. A rare gas such as Ar, Xe, or Kr can be used as the inert gas. An oxidizing species such as $O_2$, $H_2O$, or $N_2O$ can be used as the oxidizing gas. These gases supplied from gas cylinders 404a and 404b are mixed at a predetermined ratio by gas valves 405a and 405b and mass flow controllers 406a and 406b, and supplied as a gas mixture from a supply port 407 to the processing chamber 400. Note that as the gas mixture, premixed gases can be supplied into the processing chamber 400, or gases supplied from different supply lines can be mixed in the processing chamber. The processing chamber 400 contains a substrate holder 403 for holding the silicon substrate 401, and a heater 409 for adjusting the temperature of the substrate holder 403. Microwave power is preferably used as the radio-frequency power, but the present invention is not limited to the microwave power. Also, a plasma apparatus applied to the present invention is not limited to the one shown in FIG. 4, and it is also possible to use another plasma processing apparatus.

The present inventor conducted experiments by changing the various conditions of plasma oxidation, and obtained new findings. More specifically, when the mixing ratio of the oxidizing gas to the inert gas was changed from 0.003 to 0.01, metal contamination of an oxide film formed on the surface of a silicon substrate largely reduced when the oxidizing gas mixing ratio was equal to 0.007 or lower than 0.007. Note that the conventional oxidizing gas mixing ratio described in Japanese Patent Laid-Open No. 2000-286259 was 0.01 to 0.015. Furthermore, the present inventor changed the radio-frequency power from 7.0 to 8.2 [$W/cm^2$]. To suppress the plasma potential, 2.45-GHz microwave power was used as the radio-frequency power. The internal pressure of the processing chamber was held at 1 Torr, and the temperature of the substrate holder for holding a silicon substrate was set at 400° C.

FIG. 1 is a graph showing the level of Fe contamination in an oxide film formed on a silicon substrate under the above conditions. The ordinate indicates the level of Fe contamination by normalizing the level of Fe contamination to 1 when the microwave power was 8.2 [W/cm$^2$], no hydrogen gas was added, and the oxidizing gas mixing ratio was 0.01. The abscissa indicates the mixing ratio of the oxidizing gas to the inert gas. As a comparative example, FIG. 1 also shows the level of Fe contamination in a conventionally used thermal oxide film.

As shown in FIG. 1, the level of Fe contamination reduced when the mixing ratio of $O_2$ to the inert gas was equal to 0.007 or lower than 0.007. Particularly when the $O_2$ mixing ratio was equal to 0.004 or lower than 0.004, the level of Fe contamination largely reduced compared to the conventional case where the $O_2$ mixing ratio was 0.01 or more. Also, the level of Fe contamination when no hydrogen gas ($H_2$) was added to the gas mixture was lower than that when hydrogen gas was added. Furthermore, the level of Fe contamination reduced as the applied microwave power decreased. The level of Fe contamination particularly reduced when no hydrogen gas was added and the microwave power was equal to 7.6 [W/cm$^2$] or lower than 7.6 [W/cm$^2$]. When the microwave power was 7.6 [W/cm$^2$], for example, the level of Fe contamination when no hydrogen gas was added and the $O_2$ mixing ratio was 0.004 was about half that when hydrogen gas was added and the $O_2$ mixing ratio was 0.01.

As described above, the level of Fe contamination reduces when the mixing ratio of the oxidizing gas to the inert gas is equal to 0.007 or lower than 0.007, and largely reduces when the oxidizing gas mixing ratio is equal to 0.004 or lower than 0.004. Accordingly, the mixing ratio of the oxidizing gas to the inert gas is preferably higher than 0 and equal to 0.007 or lower than 0.007, and more preferably, higher than 0 and equal to 0.004 or lower than 0.004. However, the oxidation rate decreases when the mixing ratio of the oxidizing gas to the inert gas decreases. In practice, therefore, the lower limit of the mixing ratio of the oxidizing gas to the inert gas can be set within the allowable range of the oxidation rate.

Figure 2:
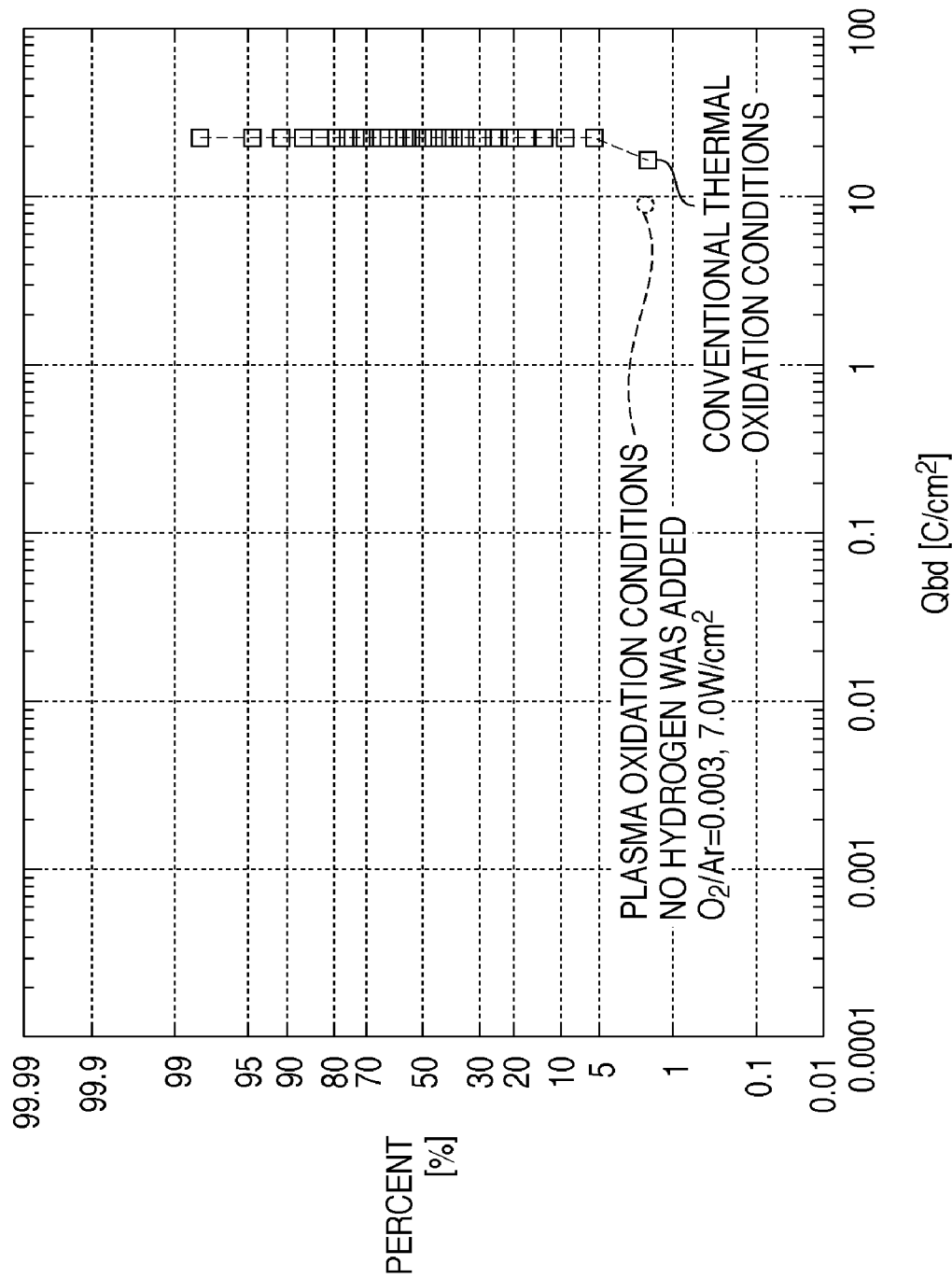
FIG. 2 is a graph showing the TDDB characteristic of a silicon oxide film.

FIG. 2 is a graph showing the TDDB (Time Dependent Dielectric Breakdown) characteristic of a silicon oxide film formed on a silicon substrate under plasma oxidation conditions in which the level of Fe contamination was largely reduced as shown in FIG. 1. This graph is called a Weibull plot. The abscissa indicates the amount of electric charges injected into the oxide film. The ordinate indicates the ratio of the number of chips in which the oxide film was broken by the amount of injected electric charges to the total number of chips obtained from one wafer. This plot exemplarily shown in FIG. 2 was obtained under the conditions that the mixing ratio of $O_2$ to Ar as the inert gas was 0.003, and the microwave power was 7.0 [W/cm$^2$]. As shown in FIG. 2, in the silicon oxide film in which the level of Fe contamination largely reduced, 95% of an accumulated breakdown amount of electric charges Qbd [C/cm$^2$] was 20 [C/cm$^2$]. This reveals that a good characteristic (oxide film breakdown voltage) equivalent to the TDDB characteristic of the conventional thermal oxide film was obtained.

Figure 3:
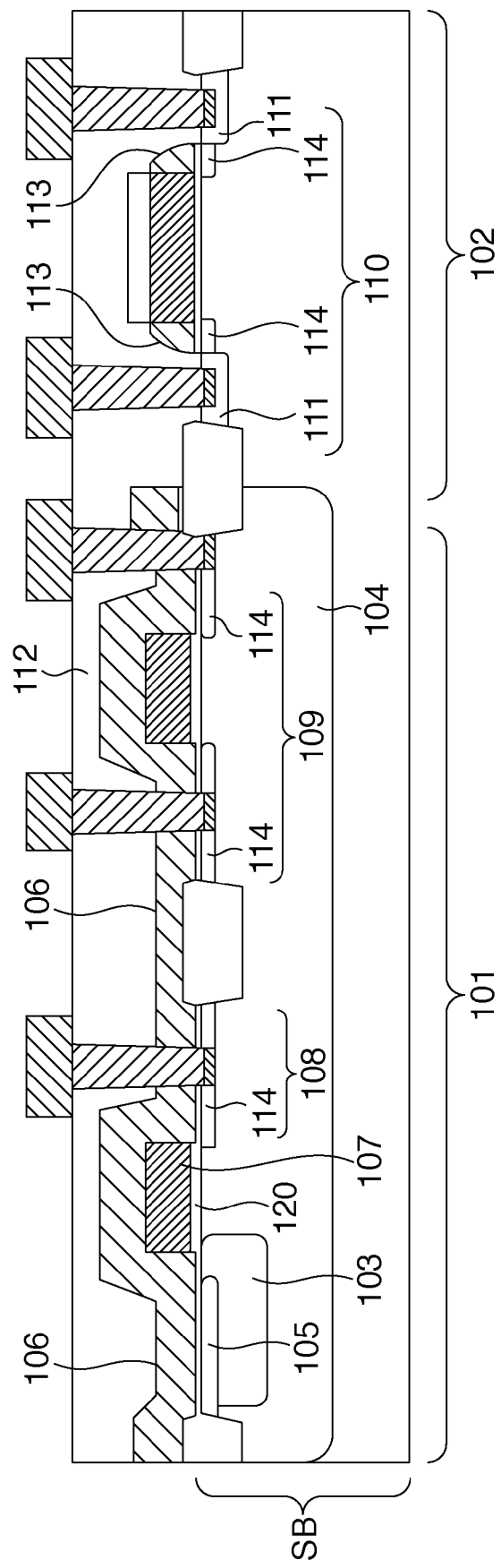
FIG. 3 is a sectional view of an image sensing apparatus using a silicon oxide film formed by an oxide film formation method according to a preferred embodiment of the present invention.

FIG. 3 is a view showing an example of the sectional structure when a silicon oxide film formed on a silicon substrate SB based on the plasma oxidation conditions in which the level of Fe contamination is largely reduced as described above is applied as a gate insulating film to an image sensing apparatus. FIG. 3 shows a photoelectric conversion area and peripheral circuit area. Reference numeral 101 denotes the photoelectric conversion area including a photodiode and the like; and 102, the peripheral circuit area. An accumulation region 103 of the photoelectric conversion area 101 formed by a first-conductivity-type semiconductor such as an n-type semiconductor is surrounded by a well 104 formed by a second-conductivity-type semiconductor such as a p-type semiconductor. The upper surface of the accumulation region 103 is covered with a surface layer 105 formed by the second-conductivity-type semiconductor. The surface layer 105 forms a part of the surface of the silicon substrate SB. An anti-reflection layer 106 for preventing light reflection is formed on the surface layer 105. A silicon oxide film 120 is formed on the surface of the silicon substrate SB by using the plasma apparatus shown in FIG. 4 under the plasma oxidation conditions that largely reduce the level of Fe contamination (as shown in FIG. 1). A transfer gate electrode 107 on the silicon oxide film 120 transfers electric charges accumulated in the accumulation region 103 to a voltage converter 108. The voltage converter 108 converts the electric charges into a voltage signal. This voltage signal is read out outside the image sensing apparatus by a read circuit formed by a MOS transistor 109 formed in the photoelectric conversion area 101, and a read circuit formed by a MOS transistor 110 formed in the peripheral circuit area 102.

A method of manufacturing the image sensing apparatus shown in FIG. 3 will be briefly explained below.

A well 104 is formed in a silicon substrate SB.

Figure 4:
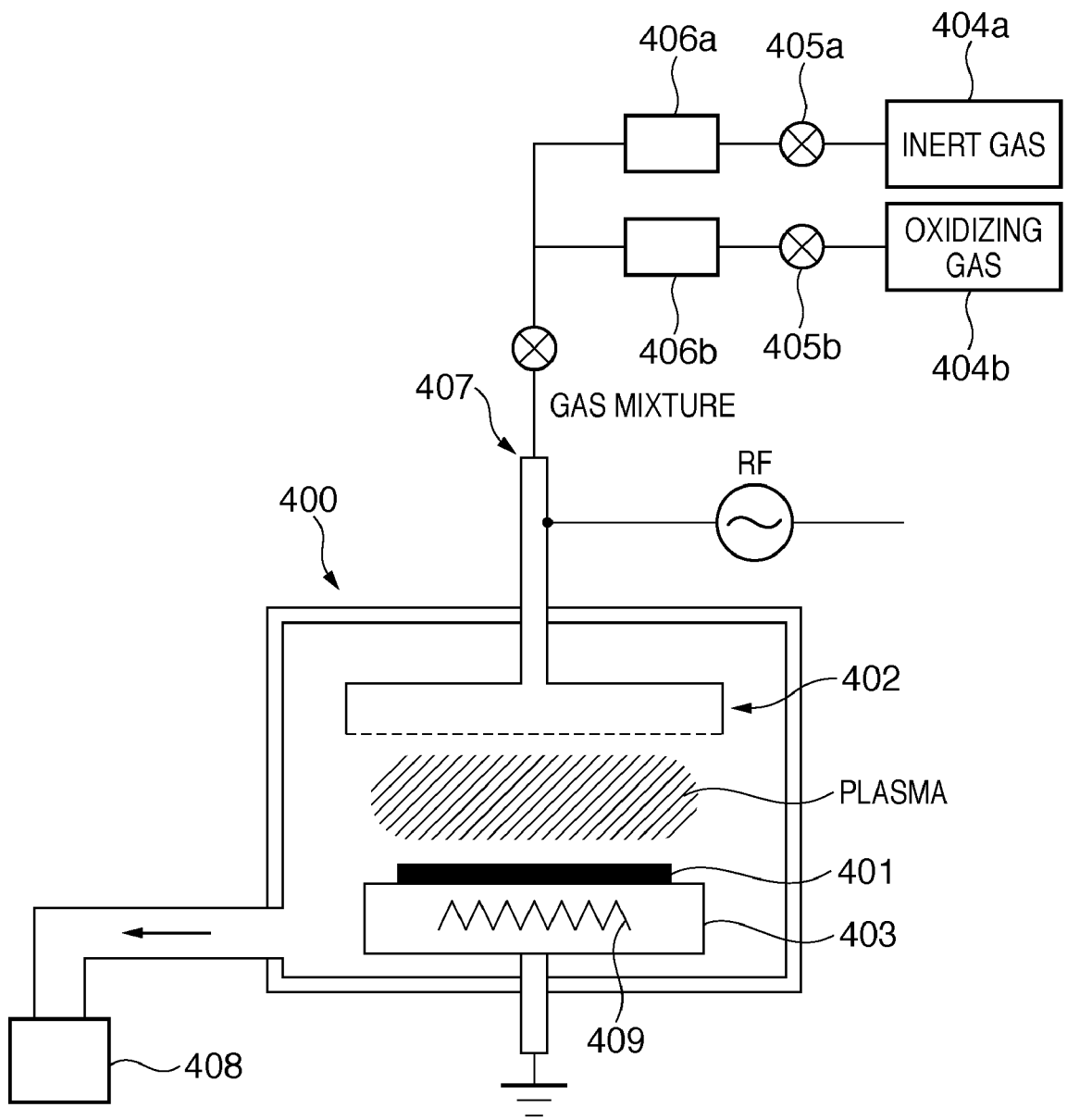
FIG. 4 is a view for explaining a method of forming an oxide film on the surface of a silicon substrate by plasma oxidation.

A silicon oxide film is formed on the surface of the silicon substrate SB by using the plasma apparatus shown in FIG. 4 under the plasma oxidation conditions that largely reduce the level of Fe contamination (as shown in FIG. 1).

A film for forming the gate electrodes (e.g., transfer gate electrodes 107) of transistors are formed on the silicon oxide film by using polysilicon or the like, and patterned by photolithography, thereby forming the gate electrodes.

After that, first-conductivity-type (e.g., N-type) semiconductor regions 114 are formed by implanting first-conductivity-type impurity ions in self-alignment with the gate electrodes.

In addition, an accumulation region 103 is formed by implanting first-conductivity-type (e.g., N-type) impurity ions, and a surface layer 105 is formed by implanting second-conductivity-type (e.g., P-type) impurity ions.

Then, a film for forming an anti-reflection layer 106 is formed (by using, e.g., silicon oxynitride) and patterned into a desired shape by lithography, thereby forming the anti-reflection layer 106 in a photoelectric conversion area 101 and side spacers 113 in a peripheral circuit area 102.

First-conductivity-type (e.g., N-type) semiconductor regions 111 are formed by implanting first-conductivity-type impurity ions in self-alignment with the side spacers 113.

After that, the image sensing device is manufactured by forming an interlayer dielectric layer 112 and contacts. In this manufacturing method, diffusion regions such as the semiconductor regions 114 may also be formed before the silicon oxide film is formed. By thus forming the image sensing apparatus, it is possible to reduce white spot defects caused by, for example, heavy metal contamination in the silicon oxide film 120 and accumulation region 103, and reduce white spots in an image obtained by an output image signal from the image sensing apparatus. Also, a silicon oxide film such as a gate insulating film is formed on the surface of the silicon substrate SB by using the plasma apparatus shown in FIG. 4. Accordingly, the silicon oxide film can be formed at a low temperature. Since this decreases the influence of heat on the diffusion regions and suppresses the diffusion of impurities, a device such as a transistor can be formed with high controllability.

A white spot defect in the image sensing apparatus will be explained below. A white spot defect in the image sensing apparatus is the abnormality of an output signal from the accumulation region 103, which occurs when a heavy metal (e.g., copper, nickel, tungsten, cobalt, or iron) diffuses in the accumulation region 103. Metal contamination in the image sensing apparatus is a serious problem because even a slight abnormality of an output signal has a large influence on an image by producing a white spot. However, white spot defects reduced in the image sensing device formed as described above. This reduction in white spot of the image sensing device occurred for all the metals including Fe shown in FIG. 1, thereby reducing the levels of contamination by all the metals.

Accordingly, it is possible to reduce white spot defects of the image sensing apparatus and to improve the characteristics of the apparatus by applying the above-mentioned silicon oxide film to the apparatus. Also, when the above silicon oxide film is applied to the image sensing apparatus, a gate insulating film can be formed at a temperature lower than, for example, 800° C. if the gate insulating film is formed by thermal oxidation. Since this reduces the influence of heat on the diffusion regions, the diffusion regions can be formed with high controllability.

As described above, the use of the oxide film formation method according to the preferred embodiment of the present invention makes it possible to form a silicon oxide film having a low level of metal contamination at a low temperature. Consequently, the oxide film breakdown voltage rises, and metal contamination in the accumulation region reduces because the amount of heavy metal that thermally diffuses from the silicon oxide film to the accumulation region reduces. This makes it possible to improve the characteristics of the image sensing apparatus.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2007-256015, filed Sep. 28, 2007 and No. 2008-242221, filed on Sep. 22, 2008, which are hereby incorporated by reference herein in their entirety.

What is claimed is:
1. A method of manufacturing a MOS transistor, the method comprising the steps of:
 (a) forming a silicon oxide film on a silicon substrate as a gate insulating film; and
 (b) forming a gate electrode on the silicon oxide film, wherein the step of forming the silicon oxide film includes
  (i) supplying a gas mixture consisting essentially of an inert gas and an oxidizing gas whose mixing ratio to the inert gas is higher than 0, and is 0.007 or lower, into a processing chamber which contains the silicon substrate therein, and
  (ii) applying a radio frequency power which is 7.0 W/cm$^2$ or higher, and is 7.6 W/cm$^2$ or lower to the gas mixture to generate a plasma, wherein the plasma oxidizes a surface of the silicon substrate to form a silicon oxide film.
2. The method according to claim 1, wherein the mixing ratio of the oxidizing gas to the inert gas is 0.004 or lower.
3. The method according to claim 1, wherein the inert gas is selected from the group consisting of Ar, Xe, and Kr, and the oxidizing gas is selected from the group consisting of $O_2$, $H_2O$, and $N_2O$.
4. The method according to claim 1, wherein the oxidizing gas is free of hydrogen.
5. The method according to claim 4, wherein the inert gas is Ar and the oxidizing gas is $O_2$.
6. A method of manufacturing an image sensing apparatus, the method comprising the steps of:
 (a) forming a silicon oxide film on a silicon substrate;
 (b) forming a transfer gate electrode on the silicon oxide film; and
 (c) forming, after the step of forming the transfer gate electrode, an accumulation region by implanting ions in the silicon substrate, wherein the accumulation region accumulates electric charges generated by photoelectric conversion,
 wherein the step of forming the silicon oxide film includes
  (i) supplying a gas mixture consisting essentially of an inert gas and an oxidizing gas whose mixing ratio to the inert gas is higher than 0, and is 0.007 or lower, into a processing chamber which contains the silicon substrate therein, and
  (ii) applying a radio frequency power which is 7.0 W/cm$^2$ or higher, and is 7.6 W/cm$^2$ or lower to the gas mixture to generate a plasma, wherein the plasma oxidizes a surface of the silicon substrate to form a silicon oxide film.

* * * * *